(12) United States Patent
Jeddeloh

(10) Patent No.: US 8,174,859 B2
(45) Date of Patent: May 8, 2012

(54) MEMORY DEVICE INTERFACE METHODS, APPARATUS, AND SYSTEMS

(75) Inventor: Joe M. Jeddeloh, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 117 days.

(21) Appl. No.: 12/619,438

(22) Filed: Nov. 16, 2009

(65) Prior Publication Data

US 2010/0061134 A1 Mar. 11, 2010

Related U.S. Application Data

(63) Continuation of application No. 11/847,113, filed on Aug. 29, 2007, now Pat. No. 7,623,365.

(51) Int. Cl.
*G11C 5/06* (2006.01)
(52) U.S. Cl. .................. 365/63; 365/51; 365/189.02
(58) Field of Classification Search .................. 365/63, 365/51, 189.02
See application file for complete search history.

(56) References Cited

U.S. PATENT DOCUMENTS

| | | | |
|---|---|---|---|
| 5,347,428 A | 9/1994 | Carson et al. | |
| 5,432,729 A | 7/1995 | Carson et al. | |
| 5,786,628 A | 7/1998 | Beilstein, Jr. et al. | |
| 5,807,791 A | 9/1998 | Bertin et al. | |
| 5,815,427 A | 9/1998 | Cloud et al. | |
| 5,982,027 A | 11/1999 | Corisis | |
| 6,081,463 A | 6/2000 | Shaffer et al. | |
| 6,141,744 A | 10/2000 | Wing | |
| 6,376,909 B1 | 4/2002 | Forbes et al. | |
| 6,461,895 B1 | 10/2002 | Liang et al. | |
| 6,600,364 B1 | 7/2003 | Liang et al. | |
| 6,856,009 B2 | 2/2005 | Bolken et al. | |
| 7,030,317 B1 | 4/2006 | Oman | |
| 7,102,219 B2 | 9/2006 | Hanaoka et al. | |
| 7,145,249 B2 | 12/2006 | Chao et al. | |
| 7,279,795 B2 | 10/2007 | Periaman et al. | |
| 7,301,748 B2 | 11/2007 | Anthony et al. | |
| 7,464,225 B2* | 12/2008 | Tsern | 711/115 |
| 7,623,365 B2 | 11/2009 | Jeddeloh | |
| 2003/0020171 A1 | 1/2003 | Dutta et al. | |
| 2003/0197281 A1 | 10/2003 | Farnworth et al. | |
| 2004/0064599 A1 | 4/2004 | Jahnke et al. | |
| 2005/0189639 A1 | 9/2005 | Tanie et al. | |
| 2006/0113653 A1 | 6/2006 | Xinoqi et al. | |
| 2006/0125069 A1 | 6/2006 | Gabara | |

(Continued)

FOREIGN PATENT DOCUMENTS

CN 1665027 A 9/2005

(Continued)

OTHER PUBLICATIONS

"International Application Serial No. PCT/US2009/056544, Search Report mailed Feb. 2, 2010", 3 pgs.

(Continued)

*Primary Examiner* — Tuan T. Nguyen
(74) *Attorney, Agent, or Firm* — Schwegman, Lundberg & Woessner, P.A.

(57) ABSTRACT

Apparatus and systems may include a substrate and a first memory device coupled to the substrate using a through wafer interconnect (TWI). An example may include an interface chip having a via to accommodate connection of the memory device to the substrate. Other apparatus, systems, and methods are disclosed.

13 Claims, 6 Drawing Sheets

U.S. PATENT DOCUMENTS

| | | | |
|---|---|---|---|
| 2006/0233012 A1 | 10/2006 | Sekiguchi et al. | |
| 2007/0001281 A1 | 1/2007 | Ishino et al. | |
| 2007/0004240 A1 | 1/2007 | Dibene et al. | |
| 2007/0013080 A1 | 1/2007 | DiBene et al. | |
| 2007/0014168 A1* | 1/2007 | Rajan | 365/201 |
| 2007/0048994 A1 | 3/2007 | Tuttle | |
| 2007/0070669 A1* | 3/2007 | Tsern | 365/51 |
| 2007/0102733 A1* | 5/2007 | Zhou et al. | 257/248 |
| 2007/0120569 A1 | 5/2007 | Sukegawa et al. | |
| 2007/0181991 A1 | 8/2007 | Ishino et al. | |
| 2008/0001271 A1 | 1/2008 | Marcinkiewicz | |
| 2008/0303031 A1 | 12/2008 | Toh | |
| 2009/0059641 A1 | 3/2009 | Jeddeloh | |
| 2010/0059898 A1 | 3/2010 | Keeth et al. | |

FOREIGN PATENT DOCUMENTS

| | | |
|---|---|---|
| CN | 101017812 A | 8/2007 |
| JP | 02287847 | 11/1990 |
| JP | 2287847 A | 11/1990 |
| WO | WO-2007029253 | 3/2007 |
| WO | WO-2008303031 A1 | 12/2008 |
| WO | WO-2009032153 A2 | 3/2009 |
| WO | WO-2009032153 A3 | 3/2009 |
| WO | WO-2010030804 A1 | 3/2010 |

OTHER PUBLICATIONS

"International Application Serial No. PCT/US2009/056544, Written Opinion mailed Feb. 2, 2010", 4 pgs.

"Terrazon 3D Stacked Microcontroller with DRAM—Fastack 3D Super-8051 Micro-controller", http://www.tezzaron.com/OtherICs/Super_8051.htm, (Link sent Oct. 2, 2007), 2 pgs.

"Terrazon 3D Stacked DRAM Bi-Star Overview", http://www.tezzaron.com/memory/Overview_3D_DRAM.htm, (Link sent Oct. 2, 2007), 1 pg.

"Terrazon FaStack Memory—3 D Memory Devices", http://www.tezzaron.com/memory/Overview_3D_DRAM.htm, (Link sent Oct. 2, 2007 Downloaded Oct. 27, 2007), 3 pgs.

Black, Bryan, et al., "Die Stacking (3D) Microarchitecture", 6 pages.

Bogatin, Eric, "Origami-Style Structure Simplifies Packaging Efficiency", *Semiconductor International*, (Feb. 1, 2003), 2 pgs.

Gann, Keith D, "Neo-stacking technology", *Irvine Sensors Corporation News Release*, (Mar. 2007), 4 pgs.

Gurnett, K, et al., "A look at the future of stacked die integrated circuits", *Military and Aerospace Electronics*, (Apr. 2003), 3 pgs.

Prophet, Graham, "Multi-chip packaging: tall stacks, low profiles", *EDN Europe*, (Dec. 5, 2005), 5 pgs.

"U.S. Appl. No. 12/209,052, Final Office Action mailed Jul. 22, 2011", 9 pgs.

"U.S. Appl. No. 12/209,052, Non Final Office Action mailed Feb. 4, 2011", 10 pgs.

"U.S. Appl. No. 12/209,052, Response filed May 4, 2011 to Non Final Office Action mailed Feb. 4, 2011", 12 pgs.

"China Patent Application No. 200880108725.5, Office Action mailed Apr. 26, 2011", 13 pgs.

"Singapore Patent Application No. 201001273-0, Letters Patent issued Apr. 29, 2011", 3 pgs.

"China Patent Application No. 200880108725.5, response filed Aug. 16, 2011 to Office Action mailed Apr. 26, 2011", 13 pgs.

"Chinese Application Serial No. 200880108725.5, Office Action mailed Sep. 6, 2011", 7 pgs.

"Chinese Application Serial No. 200880108725.5, Response filed Dec. 6, 2011 to Office Action mailed Oct. 28, 2011", 8 pgs.

"European Patent Application No. 09813621.1—EP Search Report mailed Aug. 31, 2011", 5 pages.

* cited by examiner

US 8,174,859 B2

MEMORY DEVICE INTERFACE METHODS, APPARATUS, AND SYSTEMS

This application is a continuation of U.S. application Ser. No. 11/847,113, filed Aug. 29, 2007 now U.S. Pat. No. 7,623, 365 which is incorporated herein by reference in its entirety.

BACKGROUND

Many electronic devices, such as personal computers, workstations, computer servers, mainframes and other computer related equipment, including printers, scanners and hard disk drives, make use of memory devices that provide a large data storage capability, while attempting to incur low power consumption. One type of memory device that is well-suited for use in the foregoing devices is the dynamic random access memory (DRAM).

The demand for larger capacity DRAM continues to rise and at the same time chip size limitations bound the capacity of the DRAM devices. To increase the memory capacity of DRAM devices, the surface area occupied by the components of individual memory cells has been steadily decreased so that the packing density of the memory cells on a semiconductor substrate may be increased. Shrinking the device surface area can result in reduced manufacturing yield, as well as increasing the complexity of the interconnection technology used to connect the numerous banks within the DRAM devices with other devices.

BRIEF DESCRIPTION OF THE DRAWINGS

The various embodiments of the present invention are described in detail below with reference to the following drawings.

DETAILED DESCRIPTION

Surface area reduction and a consequent increase in the packing density of memories may be achieved by decreasing the horizontal feature size of memory cell components. This can be achieved in various embodiments by forming memory cell components that are significantly three-dimensional, so that the memory cell components extend vertically into and above the substrate, in addition to generally extending across the surface of the substrate.

Figure 1:
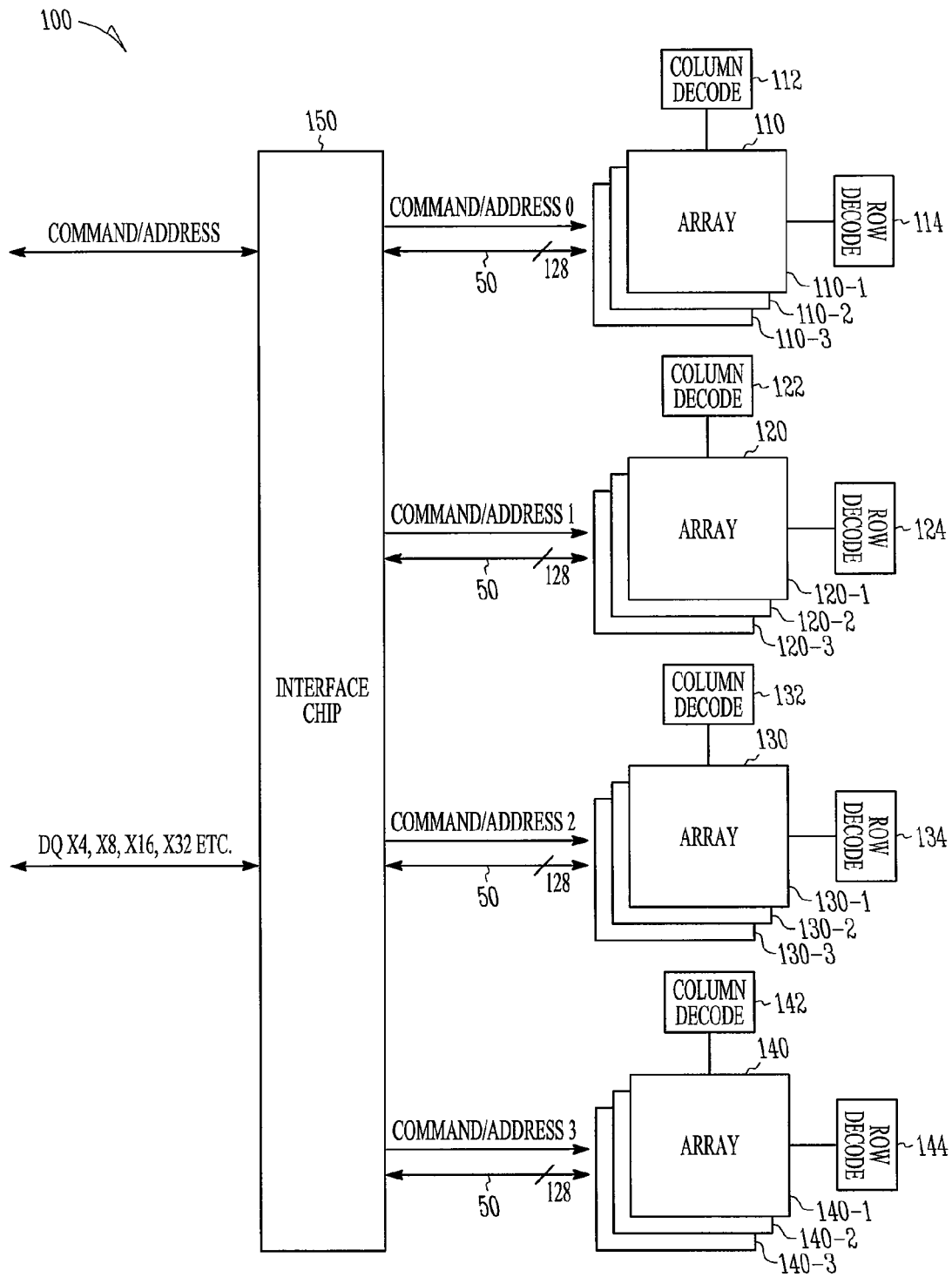
FIG. 1 illustrates a block diagram of a memory system, according to various embodiments of the invention.

FIG. 1 illustrates a block diagram of memory system 100 according to various embodiments of the invention. The memory system 100 includes an interface chip 150 coupled to memory devices 110, 120, 130, and 140 using 128-bit data busses 50. Memory device 110 includes memory arrays 110-1, 110-2, and 110-3, each having memory cells arranged in rows and columns. Similarly, memory devices 120, 130, and 140 include memory arrays 120-1, 120-2, 120-3; 130-1, 130-2, 130-3; and 140-1, 140-2, 140-3, respectively. The interface chip 150 provides memory commands to selected memory addresses within the memory devices 110-140. In some embodiments, memory devices 110-140 include Dynamic Random Access Memory (DRAM) devices. Memory devices 110-140 are coupled to column decoders 112, 122, 132, and 142, respectively. Additionally, memory devices 110-140 are coupled to row decoders 114, 124, 134, and 144, respectively. Column decoders 112, 122, 132, 142 and row decoders 114, 124, 134, 144 respond to address commands provided using data busses 50 to access memory cells within memory arrays of memory devices 110-140. The interface chip 150 controls memory devices 110-140 based on signals provided on the 128-bit data busses 50, which may be of widths other than 128 bits. In some embodiments, the interface chip 150 is configured to perform DRAM sequencing.

In some embodiments, memory devices 110-140 may comprise a flash memory device. In some embodiments, memory cells within memory arrays in memory devices 110-140 may include flash memory cells arranged in a NAND flash memory arrangement. In some embodiments, memory cells within memory arrays in memory devices 110-140 may include flash memory cells arranged in a NOR flash memory arrangement. One of ordinary skill in the art will readily recognize that memory device 100 may include other parts, which are omitted from FIG. 1 to more clearly focus on the various embodiments described herein.

The memory commands provided to the memory devices 110-140 include a programming operation to write data from the 128-bit data busses 50 to the memory cells within memory devices 110-140, a read operation to read data from the memory cells within memory devices 110-140, and an erase operation to erase data from all or a portion of memory cells within memory devices 110-140.

Figure 2A:
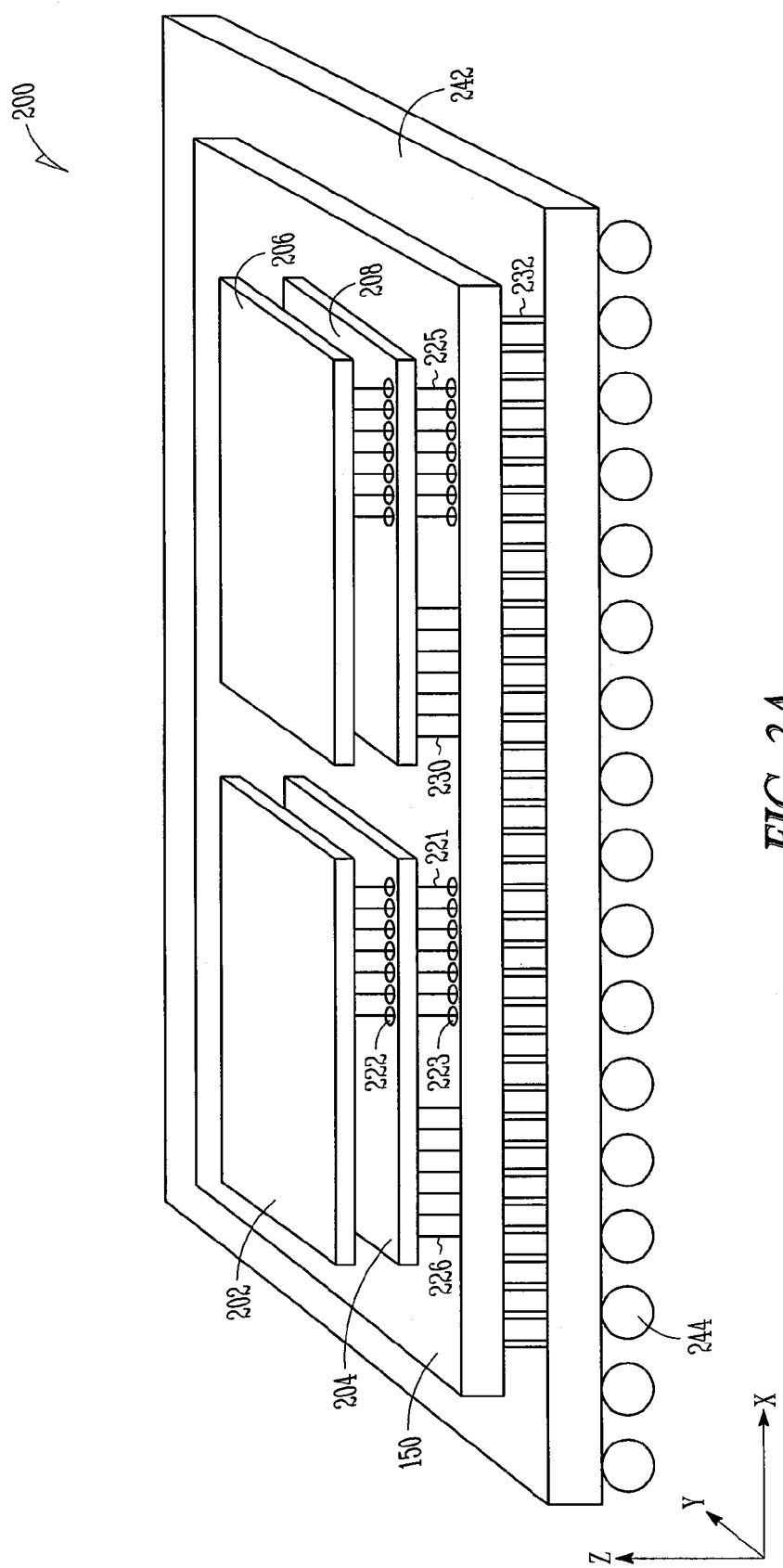
FIG. 2A illustrates a perspective view of a memory system, according to some embodiments of the invention.

FIG. 2A illustrates a perspective view of a memory system 200, in accordance with some embodiments of the invention. Memory system 200, which may be similar to or identical to the memory system 100 of FIG. 1, includes a substrate 242 having a matrix of solder balls 244, an interface chip 150, a first memory array 202, a second memory array 204, a third memory array 206, and a fourth memory array 208. In some embodiments, the first memory array 202 is disposed on the second memory array 204 and the second memory array 204 is disposed on the interface chip 150. In some embodiments, the third memory array 206 is disposed on the fourth memory array 208 and the fourth memory array 208 is disposed on the interface chip 150. The first memory array 202 is coupled to Through Wafer Interconnects (TWI) 221, which in turn are coupled to the interface chip 150. In some embodiments, TWI 221 passes through a set of vias 222 within second memory array 204 to connect with interface chip 150. In some embodiments, TWI 221 passes through a set of vias 223 within interface chip 150 to connect to devices within the substrate 242. In some embodiments, the second memory array 204 is coupled to interface chip 150 using connection pins 226. In some embodiments, TWI 230 communicatively couples memory array 208 with interface chip 150 and TWI 225 communicatively couples memory array 206 with interface chip 150. In some embodiments, connection pins 232 allow for communication between the interface chip 150 and other devices embedded within substrate 242. In some embodiments, substrate 242 may include a circuit board having circuits communicatively coupled to the interface chip 150.

Figure 2B:
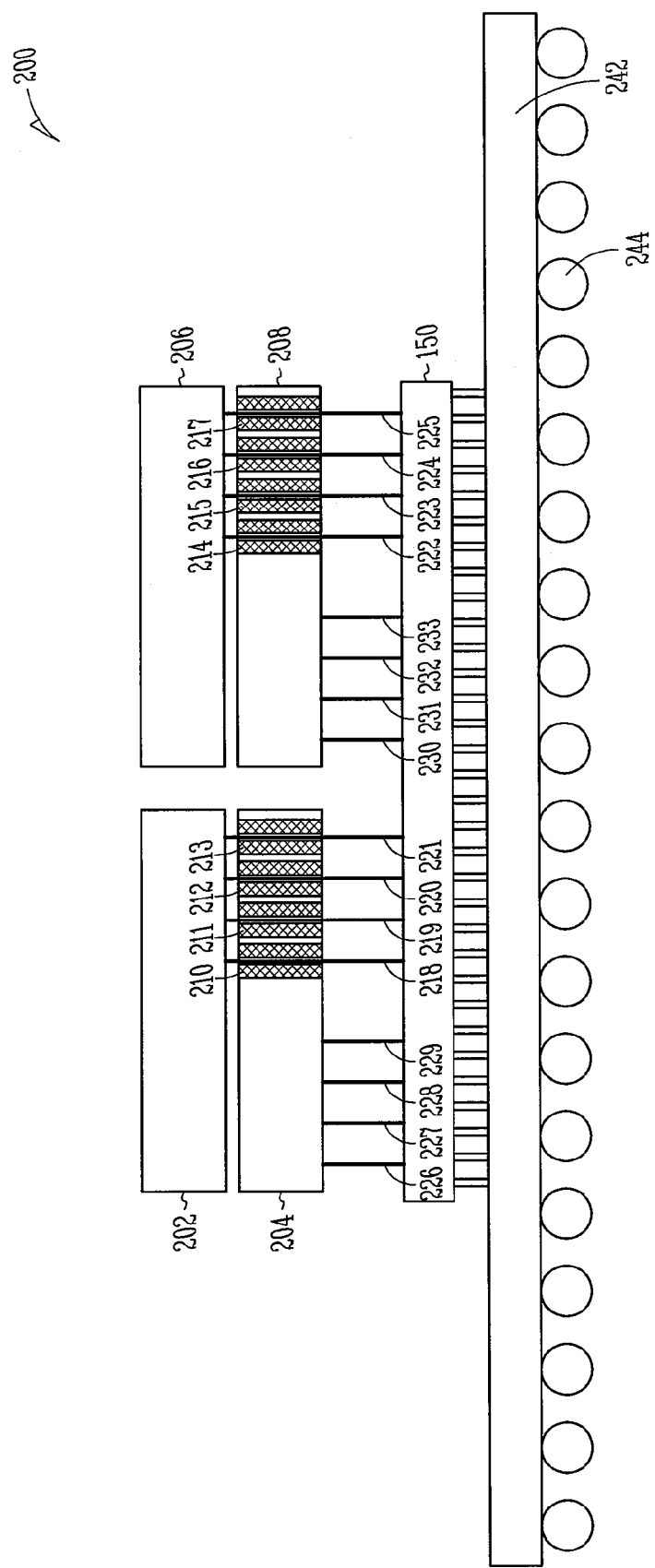
FIG. 2B illustrates a cross-sectional view of the memory system shown in FIG. 2A, according to some embodiments of the invention.

FIG. 2B illustrates a cross-sectional view of the memory system 200 shown in FIG. 2A, in accordance with some embodiments of the invention. Memory system 200 includes a substrate 242 having a matrix of solder balls 244, an interface chip 150, first memory array 202, second memory array 204, third memory array 206, and the fourth memory array 208. In some embodiments, memory system 200 includes vias 210, 211, 212, and 213 within second memory array 204 that allows the TWI 218, 219, 220, and 221 to pass through the second memory array 204 and provide connection between the first memory array 202 and the interface chip 150. In some embodiments, TWI 218, 219, 220, and 221 extend in a vertical direction (namely, z-direction as shown in FIG. 2A) with respect to a plane including the second memory die. In some embodiments, TWI 218, 219, 220, and 221 passes through the second memory die, to couple the first memory die to the interface chip 150. In some embodiments, memory system 200 includes vias 214, 215, 216, and 217 within fourth memory array 208 that allows the TWI 222, 223, 224, and 225 to pass through the fourth memory array 208 and provide connection between the third memory array 206 and the interface chip 150. In some embodiments, connection pins 226, 227, 228, and 229 provide for communication between the second memory array 204 and the interface chip 150. In some embodiments, connection pins 230, 231, 232, and 233 provide for communication between the fourth memory array 208 and the interface chip 150. In some embodiments, connection pins 232 allow for communication between the interface chip and other devices embedded within substrate 242. In some embodiments, substrate 242 may include a circuit board having circuits communicatively coupled to the interface chip 150. In some embodiments, substrate 242 includes an integrated circuit package.

Figure 3:
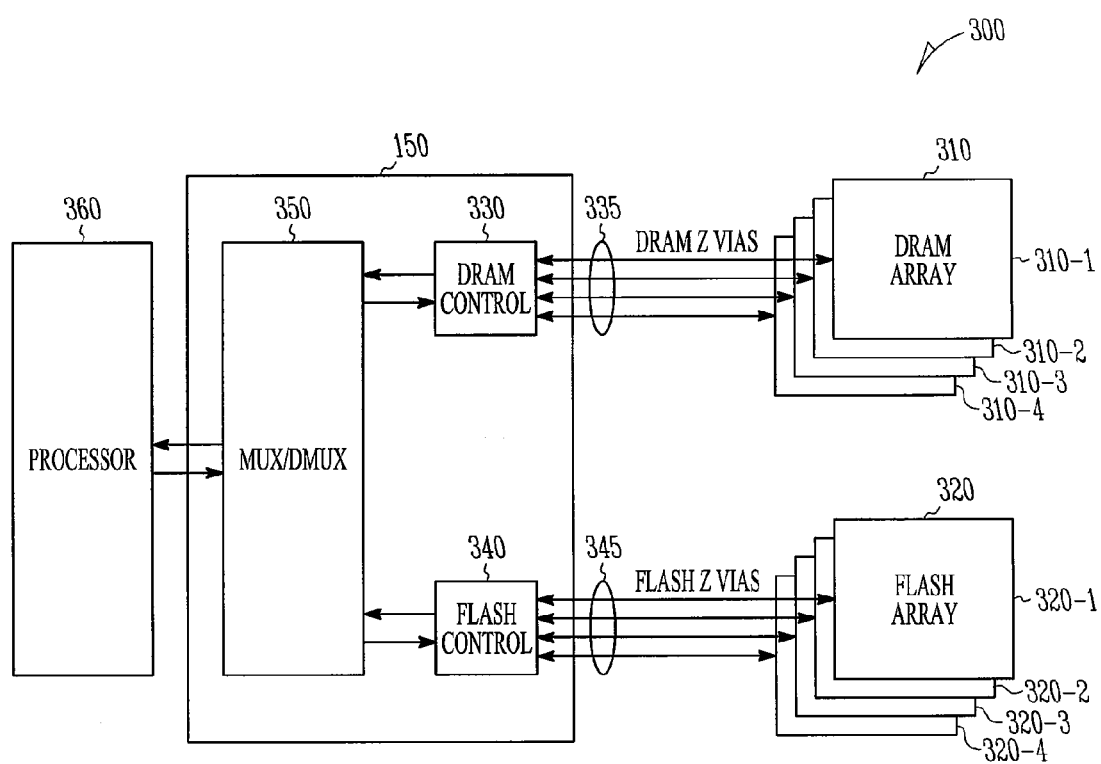
FIG. 3 illustrates a schematic representation of a system, in accordance with some embodiments of the invention.

FIG. 3 shows a schematic diagram of a system 300 according to an embodiment of the invention. System 300 includes a processing unit 360, interface chip 150, and memory dice 310 and 320. Interface chip 150 includes a multiplexer/demultiplexer circuit 350, a DRAM controller 330, and a flash controller 340. In some embodiments, memory die 310 includes DRAM arrays 310-1, 310-2, 310-3, and 310-4. In some embodiments, memory die 320 includes flash arrays 320-1, 320-2, 320-3, and 320-4. In some embodiments, DRAM controller 330 is coupled to each of the DRAM arrays 310-1, 310-2, 310-3, and 310-4 using TWI 335. In some embodiments, flash controller 340 is coupled to each of the DRAM arrays 320-1, 320-2, 320-3, and 320-4 using TWI 345. Through wafer interconnects 335 and 345 pass through vias that extend in a z-direction (vertical) within memory dice 310 and 320.

In some embodiments, interface chip 150 is configured to implement a refresh scheme to control error rates based on the type of DRAM used in memory die 320. In some embodiments, interface chip 150 is configured to operate a bad cell recovery scheme on the plurality of memory arrays included within memory die 320. In some embodiments, the interface chip 150 is programmable and configured to operate based on the type of the memory die disposed on top of it. In some embodiments, the interface chip 150 is configured to operate a bad cell recovery scheme on the plurality of memory arrays 202, 204, 206, and 208. In some embodiments, the interface chip 150 includes a pattern generator configured to generate test pattern signals that are used for testing and diagnostic analysis of memory die 320.

System 300 may also include a substrate 242 (see FIG. 2A), such as a circuit board, on which some components of system 300 may be located. Substrate 242 may include terminals 244 coupled to a power source (not shown) to provide power or voltage to the components of system 300 that includes memory devices 310 and 320. The power source may provide alternating current to direct current (AC to DC) conversion circuitry, a battery, and others. Memory devices 110-140 may comprise a volatile memory device, a non-volatile memory device, or a combination of both. For example, memory device 110 may comprise a DRAM device, a static random access memory (SRAM) device, a flash memory device, or a combination of these memory devices. Interface chip 150 may include a communication module for wired or wireless communication. In some embodiments, the number of components of system 300 may vary.

Processing unit 360 processes data transferred to and from other components via bus 50. Processing unit 360 may include a general-purpose processor or an application specific integrated circuit (ASIC). Processing unit 360 may comprise a single-core processing unit or a multiple-core processing unit.

In some embodiments, memory devices 310 and 320 may include one or more embodiments of memory devices described above with reference to FIG. 1, FIG. 2A, and FIG. 2B.

In some embodiments, a method of operation of system 300 includes sending and receiving data between the processor 360 and the interface chip 150 that includes a multiplexer/demultiplexer 350 and memory controllers 330, 340. The method may also include sending and receiving the above data from the interface chip 150 to a number of memory dice 310, 320 using through wafer interconnects 335, 345, where the through wafer interconnects 335, 345 pass through vias formed in the z-direction within the memory dice 310, 320. The method also includes storing the above data in the memory dice 310, 320, wherein each of the memory dice 310, 320 and includes a number of memory arrays 310-1, 310-2, 310-3 and 320-1, 320-2, 320-3, respectively. In some embodiments, the method includes storing the data in a DRAM array 310. In some embodiments, the method includes storing the data in a NAND flash array 320. In some embodiments, the method includes storing the data in a NOR flash array 320.

System 300 may be included in computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, DVD players, video cassette recorders, DVD recorders, camcorders, digital cameras, MP3 (Motion Picture Experts Group, Audio Layer 3) players, video games, watches, etc., and the like.

Figure 4:
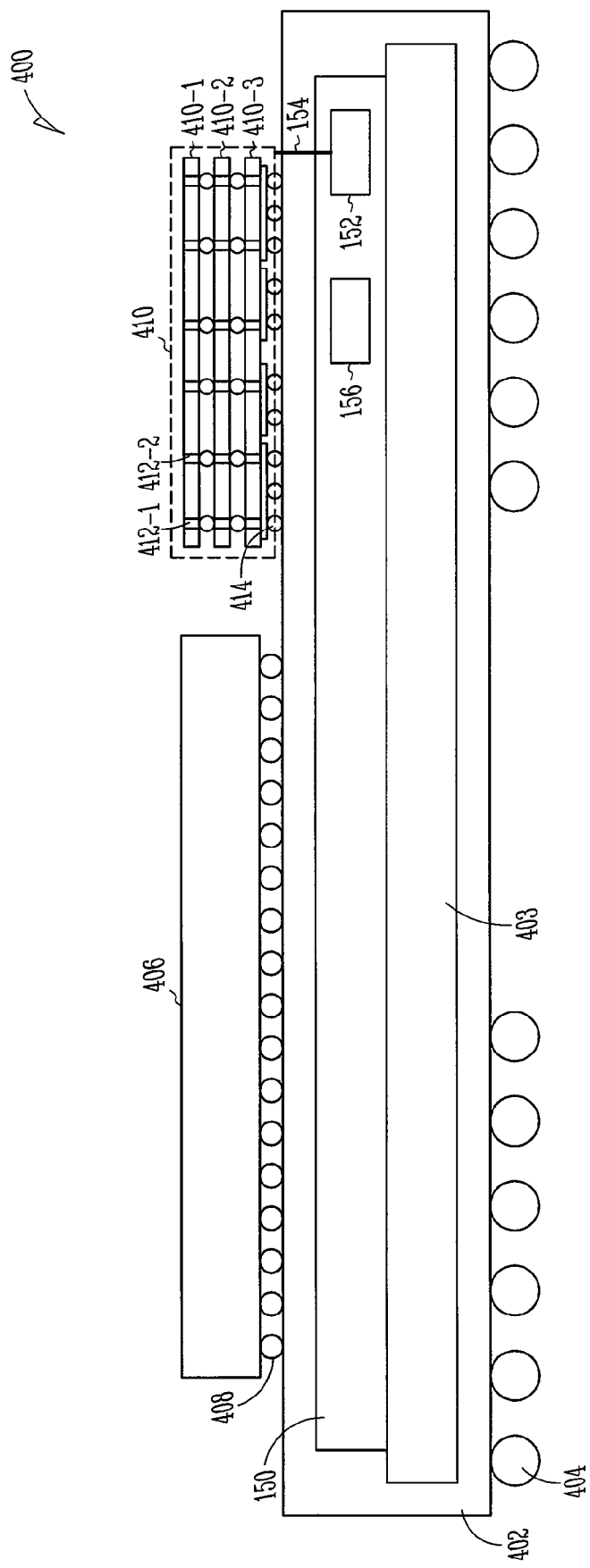
FIG. 4 illustrates a cross-sectional view of the system shown in FIG. 3, according to some embodiments of the invention.

FIG. 4 illustrates a cross-sectional view of system 400 similar to that shown in FIG. 3, according to some embodiments of the invention. System 400 includes a substrate (or package) 402 having an interface chip 150 embedded within the substrate 402, a processor 406 attached to the substrate 402 using a matrix of solder balls 408, a memory device 410 including memory arrays 410-1, 410-2, 410-3 with TWI 412-1, 412-2 that connect memory arrays 410-1, 410-2, 410-3 with the interface chip 150. In some embodiments, the interface chip 150 is disposed on the processor 406 and the memory device 410 is disposed on the interface chip 150. In some embodiments, package 402 may include a circuit board 403 and interface chip 150 is disposed on the circuit board 403 and the memory device 410 is disposed on the interface chip 150.

In some embodiments, substrate 402 is attached to a matrix of solder balls 404 that enables system 400 to be mounted on a circuit board having other devices. In some embodiments, memory device 410 is attached to a matrix of solder balls 414 used to communicatively couple the memory device 410 to substrate 402.

In some embodiments, interface chip 150 acts as an interconnection device and an I/O driver. In some embodiments, the interface chip 150 includes traditional functional blocks present within DRAM dice, such as I/O pads, delayed-locked loop (DLL) circuitry, and First In, First Out (FIFO) circuitry that provides read and write pointers, storage, and control logic. Transferring these functional blocks, which are well-known to those of ordinary skill in the art, from the DRAM dice into the interface chip 150 allows for the increase in storage area of the DRAM dice.

In some embodiments, the interface chip 150 is coupled to 32 different memory banks (each having several memory arrays; other numbers of banks are possible) with independent interconnects such as the TWI shown in FIG. 4. In some embodiments, the interface chip 150 is coupled to a set of TWI that are configured to provide different types of interconnection based on the end user application. In some embodiments, the TWI can be configured to provide connectivity between independent groups of DRAM dice and the interface chip 150.

In some embodiments, the interface chip 150 is configured to transmit and receive test pattern signals between the interface chip 150 and the DRAM dice to calculate the optimum timing level for each interconnect. In some embodiments, the interface chip 150 can have any number (e.g., 8, 16, 32, 64, 128, etc.) of I/O pads that provide for external system interconnection. In some embodiments, test pattern signals are transmitted and received between I/O terminals of the interface chip 150 and the DRAM dice, and a training algorithm is executed to calculate an optimum timing for each input/output connection.

In some embodiments, the interface chip 150 is configured to perform power management within system 400, wherein the interface chip 150 is operated at a voltage sufficient to prevent the generation of error bits in the communication between the interface chip 150 and memory device 410.

In some embodiments, the interface chip 150 is configured to perform Error Check and Correction (ECC) during data communication between the memory device 410 and the processor 406 disposed on the substrate 402. In some embodiments, the interface chip 150 is configured to perform power management of system 400 by operating at some voltage that is determined beforehand such that no error bits are generated at that voltage.

In some embodiments, the interface chip 150 includes a diagnostic and Built in Self-Test (BIST) module 152. In some embodiments, the BIST module is coupled to a maintenance bus 154 that is coupled between the interface chip 150 and memory device 410. In some embodiments, the BIST module is configured to send command signals and data to the memory device 410 through the maintenance bus 154 that are received from a user. In some embodiments, the maintenance bus 154 is also used to receive the results of the diagnostic testing. In some embodiments, the diagnostic and BIST module 152 generates control signals and forwards the user supplied command and data signals to carry out the commands of the user. For example, the diagnostic and BIST module 152 may invoke a pattern generator program or hardware module to begin generating a test pattern in accordance with the user's commands and data, and also forward the user provided memory commands to a sequencer 156 for translation into control signals that will be applied to the memory device 410 for carrying out diagnostic operations of memory device 410.

Figure 5:
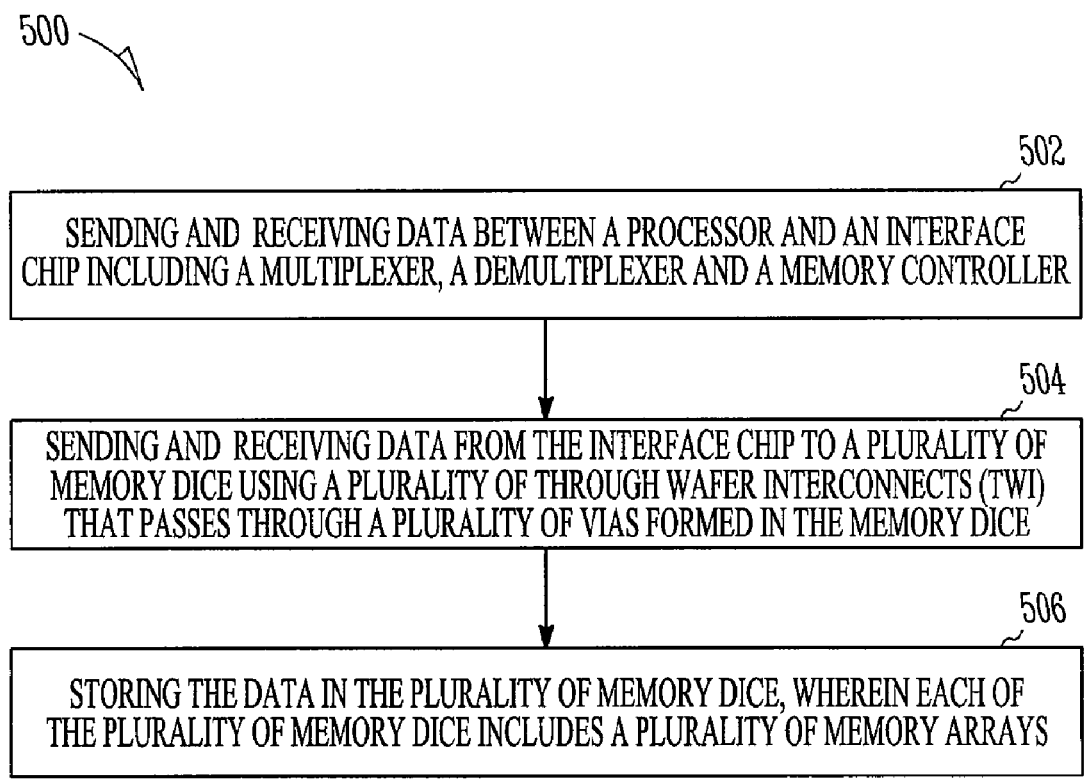
FIG. 5 illustrates a flow chart of a method of operation of system shown in FIG. 3, according to some embodiments of the invention.

FIG. 5 illustrates a flow chart of a method 500 of operation of system shown in FIG. 3, according to some embodiments of the invention. At 502, method 500 includes sending and receiving data between a processor and an interface chip including a multiplexer, a demultiplexer and a memory controller. At 504, method 500 includes sending and receiving the data from the interface chip to a plurality of memory dice using a plurality of Through Wafer Interconnects (TWI) that passes through a plurality of vias formed in the memory dice. At 506, method 500 includes storing the data in the plurality of memory dice, wherein each of the plurality of memory dice includes a plurality of memory arrays. In some embodiments, at 506, the method includes storing the data in a DRAM array. In some embodiments, at 506, the method includes storing the data in a NAND flash array. In some embodiments, at 506, the method includes storing the data in a NOR flash array.

The apparatus, systems, and methods disclosed herein provides for increased speed and through put while accessing memory arrays in addition to achieving a higher density of memory arrays compared to conventional designs. In some embodiments, as a result, the DRAM die size is also reduced. Additionally, use of through wafer interconnects allows for a larger number of interconnects traversing shorter distances and consequently improving the speed of each connection established by the interconnects. Moreover, the apparatus, systems and methods disclosed herein provides for processors coupled to memory arrays that are capable of handling more bandwidth with reduced latency in designs having improved packing density.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein, individually or collectively, by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

Methods, apparatus, and systems have disclosed memory device connection schemes that increase memory capacity within a given horizontal space. Various embodiments include a substrate, an interface chip disposed on the substrate, a first memory die having a plurality of memory arrays disposed on the interface chip, with the first memory die coupled to a plurality of through wafer interconnects (TWI). Various embodiments include a second memory die having a plurality of memory arrays disposed on the first memory die, the second memory die including a plurality of vias, wherein the plurality of vias are configured to allow the plurality of TWI to pass through the second memory die. The second memory die, in turn, may be coupled to a second plurality of TWI, and the interface chip can be used to communicatively couple the first memory die and the second memory die using the first and second plurality of TWI.

One or more embodiments provide an improved mechanism for interconnecting memory devices. Furthermore, various embodiments described herein can improve the density of some memory arrays within memory devices and, as a result, reduce the size of memory devices.

What is claimed is:

1. An apparatus comprising:
a substrate;
an interface chip disposed on the substrate;
a first memory device coupled to the interface chip using a first through wafer interconnect (TWI); and
a second device disposed on the interface chip between the interface chip and the first device, the second device including a via, wherein the via is configured to allow the first TWI to pass through the second device, the second device including connection pins to electrically couple the second device to the interface chip.

2. The apparatus of claim 1, wherein the interface chip includes a via.

3. The apparatus of claim 2, wherein the first memory device is coupled to the substrate using a second TWI extending through the via of the interface chip.

4. The apparatus of claim 2, wherein the second device is coupled to the substrate using a second TWI extending through the via of the interface chip.

5. The apparatus of claim 1, wherein the second device includes a memory array.

6. The apparatus of claim 1, wherein the first device includes flash memory.

7. The apparatus of claim 1, wherein the interface chip includes a communication module to provide wireless communication.

8. A system comprising:
a first memory device coupled to a first plurality of through wafer interconnects (TWI);
a second memory device including a plurality of vias configured to allow the first plurality of TWI to pass through the second memory device;
an interface chip coupled to the first memory device and the second memory device, the first and the second memory devices disposed on the interface chip; and
a processing unit communicatively coupled to the interface chip, the first memory device, and the second memory device,
wherein the interface chip is coupled to the first memory device using the first plurality of TWI, and
wherein the interface chip is coupled to the second memory device using connection pins.

9. The system of claim 8, wherein the first memory device includes a dynamic random access memory (DRAM) array.

10. The system of claim 8, wherein the first memory device includes a NAND flash memory array.

11. The system of claim 8, wherein the first memory device includes a NOR flash memory array.

12. The system of claim 8, wherein the interface chip further comprises a communication module to provide at least one of wired and wireless communication.

13. The system of claim 8, wherein the interface chip is embedded within the substrate.

* * * * *